(12) United States Patent
Beasom

(10) Patent No.: US 6,765,247 B2
(45) Date of Patent: Jul. 20, 2004

(54) INTEGRATED CIRCUIT WITH A MOS STRUCTURE HAVING REDUCED PARASITIC BIPOLAR TRANSISTOR ACTION

(75) Inventor: James D. Beasom, Melbourne Village, FL (US)

(73) Assignee: Intersil Americas, Inc., Miltipas, CA (US)

( * ) Notice: Subject to any disclaimer, the term of this patent is extended or adjusted under 35 U.S.C. 154(b) by 131 days.

(21) Appl. No.: 09/977,188

(22) Filed: Oct. 12, 2001

(65) Prior Publication Data

US 2003/0071291 A1 Apr. 17, 2003

(51) Int. Cl.$^7$ .............................................. H01L 29/76
(52) U.S. Cl. ........................................................ 257/288
(58) Field of Search ................................. 257/288, 335, 257/336, 337, 338, 339, 340, 341, 342, 343

(56) References Cited

U.S. PATENT DOCUMENTS

| | | | |
|---|---|---|---|
| 4,564,770 A | | 1/1986 | Sherman et al. |
| 4,969,852 A | * | 11/1990 | Osterwald .................... 455/212 |
| 5,138,177 A | * | 8/1992 | Morgan et al. ............. 250/551 |
| 5,698,867 A | * | 12/1997 | Bauer et al. ................. 257/138 |
| 5,821,144 A | | 10/1998 | D'Anna et al. |
| 6,035,235 A | * | 3/2000 | Perttu et al. .................... 607/5 |
| 6,133,107 A | * | 10/2000 | Menegoli .................... 438/306 |
| 6,143,042 A | | 11/2000 | Rogers |
| 6,166,520 A | | 12/2000 | Waters et al. |
| 6,166,925 A | | 12/2000 | Richter et al. |
| 6,172,398 B1 | * | 1/2001 | Hshieh ........................ 257/330 |
| 6,239,958 B1 | * | 5/2001 | Kato et al. .................... 361/56 |
| 6,368,920 B1 | * | 4/2002 | Beasom ....................... 438/270 |
| 2001/0048119 A1 | * | 12/2001 | Mizuno et al. .............. 257/192 |
| 2002/0017684 A1 | * | 2/2002 | Blanchard et al. .......... 257/342 |

FOREIGN PATENT DOCUMENTS

| | | | |
|---|---|---|---|
| EP | 0747966 | | 11/1996 |
| EP | 0747958 | | 12/1996 |
| JP | 63281468 A | * | 11/1988 |
| JP | 7-193231 | | 9/2001 |
| WO | WO 00/10204 | | 2/2000 |

* cited by examiner

Primary Examiner—Wael Fahmy
Assistant Examiner—Dana Farahani
(74) Attorney, Agent, or Firm—Fogg and Associates, LLC; Scott V. Lundberg

(57) ABSTRACT

An integrated circuit having a MOS structure with reduced parasitic bipolar transistor action. In one embodiment, a MOS integrated circuit device comprises a substrate having a working surface, at least one body region and for each body region a source and a layer of narrow band gap material. Each body region is formed in the substrate proximate the working surface of the substrate. Each layer of narrow band gap material is positioned in a portion of its associated body region and proximate the working surface of the substrate. Each layer of narrow band gap material has a band gap that is narrower than the band gap of the substrate in which each of the body regions are formed. Each source region is formed in an associated body region. At least a portion of each source region is also formed in an associated layer of narrow band gap material.

45 Claims, 11 Drawing Sheets

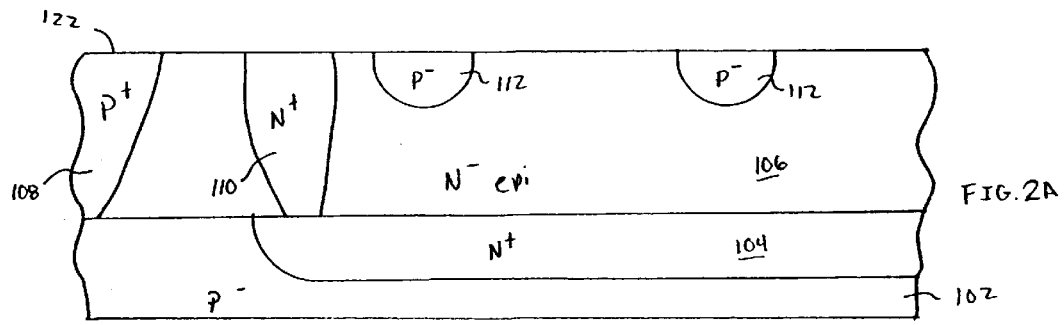
FIG. 2A
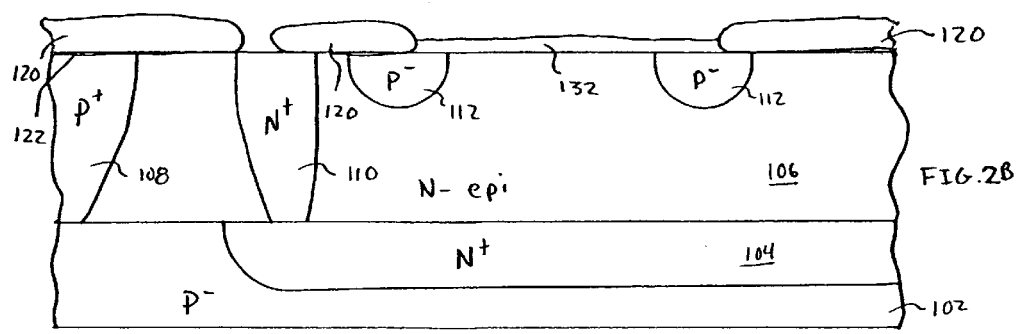
FIG. 2B
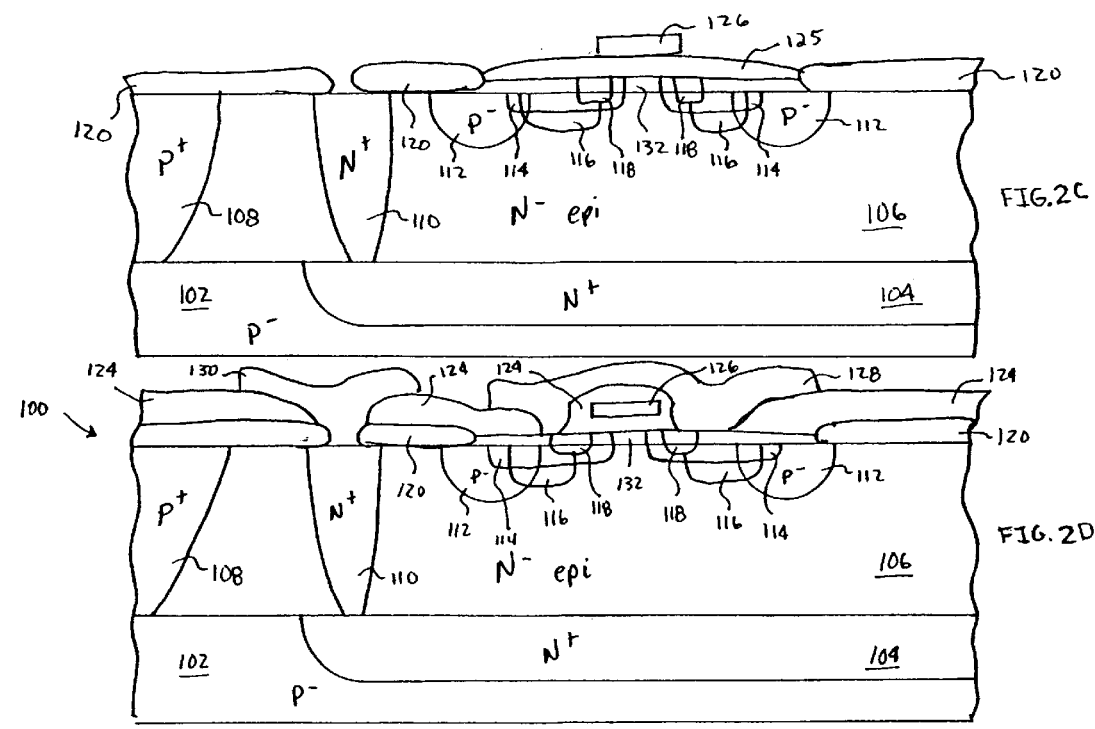
FIG. 2C
FIG. 2D

INTEGRATED CIRCUIT WITH A MOS STRUCTURE HAVING REDUCED PARASITIC BIPOLAR TRANSISTOR ACTION

TECHNICAL FIELD

The present invention relates generally to MOS structures incorporated in integrated circuits and in particular the present invention relates to an integrated circuit having a MOS structure with reduced parasitic bipolar transistor action.

BACKGROUND

Integrated circuits incorporate complex electrical components formed in semiconductor material into a single device. Generally, an integrated circuit comprises a substrate upon which a variety of circuit components are formed wherein each of the circuit components are electrically isolated from each other. Integrated circuits are made of semiconductor material. Semiconductor material is material that has a resistance that lies between that of a conductor and an insulator. Semiconductor material is used to make electrical devices that exploit its resistive properties.

Semiconductor material is typically doped to be either a N type or a P type. N type semiconductor material is doped with a doping type impurity that generally conducts current via electrons. P type semiconductor material is doped with an acceptor-type impurity that conducts current mainly via hole migration. A N type or P type having a high impurity or high dopant concentration or density is denoted by a "+" sign. A N type of P type having a low impurity or low dopant concentration or density is denoted by a "−" sign.

One type of circuit component is a metal-oxide semiconductor (MOS) transistor. A transistor is a device used to amplify a signal or open and close a circuit. A typical transistor comprises a substrate having layers of varying semiconductor materials that form a source, a drain and a gate. An integrated circuit may comprise a plurality of transistors created from a single substrate to form a circuit.

MOS gated devices, including transistor devices formed in an integrated circuit, typically suffer from degraded performance in safe operating areas and unclamped inductive switching when parasitic bipolar components inherent in MOS gated devices approach their collector-emitter break down voltage (BVCEO). This can be referred to as parasitic bipolar transistor action. Double Diffused Metal Oxide Silicon (DMOS) transistors and Insulated Gate Bipolar Transistors (IGBT), are examples of MOS gated devices. For a NDMOS, the parasitic bipolar component is a NPN.

Referring to the NDMOS example, current can flow from a drain (N type) of the device through a body (P type) positioned under a source (N type) to a surface body contact. The voltage drop developed by this current flow can reach the turn on voltage for the body-source junction along a portion of the junction remote from the surface body contact. That portion of the body-source junction turns on and injects electrons across the body into the drain when the turn on voltage is reached. The blocking voltage of the device drops from proximately BVCBO of the parasitic NPN to approximately collector-emitter break down voltage (BVCEO) of the NPN. This is the basis for reduced performance. The relationship of the breakdown can be approximated by the equation $BVCEO = BVCBO/(HFE)^{1/4}$. Wherein HFE represents a parasitic current gain of a bipolar transistor. HFE can also be referred to as beta. For example, for a parasitic NPN HFE=20, the BVCEO will be about ½ the BVCBO. By reducing the HFE, the parasitic bipolar transistor action is reduced thereby enhancing the performance of the device.

The degradation resulting from this parasitic action can be significant. One method of minimizing its impact is to include a P+ body contact region under a portion of the source that is not proximate a channel end of the source where it would cause an unacceptable increase in the threshold voltage. The P+ contact region reduces the resistance through which the current flows thereby increasing the current required to cause the degradation to occur. The use of the P+ contact region provides a useful improvement in device performance but further improvements are desired.

For the reasons stated above and for other reasons stated below which will become apparent to those skilled in the art upon reading and understanding the present specification, there is a need in the art for a MOS structure in an integrated circuit that has reduced parasitic HFE levels when the parasitic components are activated.

SUMMARY

The above-mentioned problems with high voltage MOS structures and other problems are addressed by the present invention and will be understood by reading and studying the following specification.

In one embodiment, a metal oxide semiconductor (MOS) integrated circuit device is disclosed comprising a substrate, at least one body region, a layer of narrow band gap material for each body region and a source region formed in each body region. The substrate has a working surface. Each body region is of a first conductivity type. Moreover, each body region is formed in the substrate proximate the working surface of the substrate. Each layer of narrow band gap material is positioned in a portion of its associated body region and proximate the working surface of the substrate. Each layer of narrow band gap material has a band gap that is narrower than the band gap of the substrate in which each of the body regions are formed. Each source region is of a second conductivity type. Moreover, each source region is formed in an associated layer of narrow band gap material.

In another embodiment, a quasi-vertical double diffused metal oxide semiconductor (DMOS) transistor for an integrated circuit is disclosed comprising a substrate, one or more body regions, a source formed in at least one body region and a layer of narrow band gap material. The substrate has a surface. The one or more body regions are formed in the substrate proximate the surface of the substrate. Each of the body regions is of the first conductivity type. Each source is of a second conductivity type with a high doping density. The layer of narrow band gap material is positioned adjacent the surface of the substrate and the body regions. The narrow band gap material has a band gap narrower than a band gap of the body regions. In addition, at least a portion of each source is formed in the layer of narrow band gap material.

In another embodiment, a lateral DMOS transistor for an integrated circuit is disclosed comprising a substrate, a drain contact, a gate, a body, a source and a layer of narrow band gap material. The substrate is of a first conductivity type with a low doping concentration and has a surface. The drain contact is of a second conductivity type with a high doping concentration and is formed in the substrate adjacent the surface of the substrate. The gate is positioned on the surface of the substrate. A body of the first conductivity type is formed in the substrate adjacent the surface of the substrate. A source of the second conductivity type with high doping density is formed in the body. Moreover, the gate is positioned in between the source and the drain contact. The layer of narrow band gap material is positioned in a surface portion of the body and at least a portion of the source. The layer of narrow band gap material has a narrower band gap than the band gap of the substrate.

In another embodiment, a method of forming a MOS device in an integrated circuit is disclosed. The method comprises forming a body region in a substrate adjacent a surface of the substrate. Forming a source in the body region. Forming a layer of narrow band gap material adjacent the surface of the substrate. The layer of narrow band gap material having a band gap narrower than a band gap the substrate material and at least a portion of the source is within the layer of narrow band gap material.

In another embodiment, a method of forming a quasi-vertical NDMOS for an integrated circuit is disclosed. The method comprises forming a patterned first dielectric layer on the surface of the substrate, wherein a first portion of the substrate is exposed by the pattern. Forming a layer of narrow band gap material on the exposed first portion of the surface of the substrate. The layer of narrow band gap material has a band gap that is narrower than the band gap of the substrate. Forming a second dielectric layer on the narrow band gap material. Depositing a gate proximate a medial portion of the second dielectric layer. Forming a pair of body regions in the substrate. The gate is positioned between the body regions. Forming a source in each body region, wherein at least apportion of the source is also formed in the layer of narrow band gap material.

In another embodiment, a method of forming a quasi-vertical NDMOS for an integrated circuit is disclosed. The method comprises forming a patterned first dielectric layer on the surface of the substrate, wherein a first portion of the substrate is exposed by the pattern. Forming a layer of gate dielectric on the exposed first portion of the surface of the substrate. Depositing a gate proximate a medial portion of the layer of gate dielectric. Forming a pair of body regions in the substrate, wherein the gate is positioned between the body regions. Forming layers of narrow band gap material in portions of the body regions. The layers of narrow band gap material have a narrower band gap than the band gap of the remaining portions of the body regions. Forming a source in each body region, wherein at least apportion of the source is also formed in the layer of narrow band gap material.

In another embodiment, a method of forming a lateral DMOS for an integrated circuit is disclosed. The method comprising forming a body of a first conductivity type in a substrate of a first conductivity type with a low doping density, wherein the body is positioned adjacent a surface of the substrate. Forming a layer of narrow band gap material in each body region adjacent the surface of the substrate. The layer of narrow band gap material has a band gap that is narrower than the band gap of the remaining portions of the body region. Forming a source of a second conductivity type with a high doping density in the body, wherein at least a portion of the source is formed in the layer of narrow band gap material. The narrow band gap material suppresses carrier injection form the source into the body thereby reducing parasitic HFE.

In another embodiment, a vertical DMOS device is disclosed comprising a substrate, at least one gate, a dielectric layer insulating each gate from the substrate, a drain region formed in the substrate, at least one body region, a layer of narrow band gap material and a source for each body region.

The at least one body region is formed in the substrate adjacent the drain region and proximate a working surface of the substrate. The layer of narrow band gap material is formed in each body region adjacent the surface of the substrate. The layer of narrow band gap material has a narrower band gap than the band gap of the remaining portions of the body region. Each source is formed in an associated body region. At least a portion of each source is also formed in the layer of narrow band gap material. The layer of narrow band gap material suppresses carrier injections from each of the source regions into associated body regions thereby reducing HFE.

In another embodiment, a method of forming a vertical DMOS is disclosed. The method comprises forming a drain region in a substrate of a first conductivity type with a low dopant density. Forming a body region in the substrate of a second conductivity type over the drain region. Forming a layer of narrow band gap material in the substrate, wherein the layer of narrow band gap material has a narrower band gap than portions of the body region. Forming at least one source region of the first conductivity type with high dopant density in the body, wherein at least a portion of each source region is formed in the layer of narrow band gap material. Forming at least one gate.

In another embodiment, a switching power supply control circuit is disclosed comprising a diode bridge, a transformer, a quasi-vertical DMOS transistor and control circuitry. The diode bridge is used to perform full rectification of the input AC voltage. The transformer is coupled to the diode bridge to provide galvanic isolation and voltage conversion. The quasi-vertical DMOS transistor coupled to control the voltage through the transformer. The control circuitry is coupled to a gate of the quasi-vertical DMOS transistor to switch the DMOS transistor on and off, wherein the control circuitry controls a duty cycle of the DMOS transistor to achieve a desired output from the transformer. The quasi-vertical DMOS transistor comprises a substrate, one or more body regions, a source for each body region and a layer of narrow band gap material. The substrate is of a first conductivity type with a low doping density. The substrate has a surface. The gate is formed overlaying the surface of the substrate. The one or more body regions are formed in the substrate proximate the surface of the substrate. Each of the body regions is of the first conductivity type. Each source is of a second conductivity type with a high doping density. Each source and each body are positioned proximate an associated edge of the gate. The layer of narrow band gap material is positioned adjacent the surface of the substrate and the body regions. The narrow band gap material has a band gap narrower than the semiconductor material of the body. In addition, at least a portion of each source is formed in the layer of narrow band gap material to reduce parasitic bipolar transistor action.

In yet another embodiment, a solid state relay integrated circuit is disclosed comprising a photo diode stack, a first high voltage lateral DMOS and a second high voltage lateral DMOS. The photo diode stack is used to drive a voltage having a first output and a second output. The first high voltage lateral DMOS has a gate, source and drain. The gate of the first high voltage DMOS is coupled to the first output of the photo diode stack. The source of the first high voltage DMOS is coupled to the second output of the photo stack diode. The second high voltage lateral DMOS has a gate, source and drain. The gate of the second high voltage lateral DMOS is coupled to the first output of the photo diode stack. The source of the second high voltage lateral DMOS is coupled to the second output of the photo diode stack. The first and second high voltage lateral DMOS comprise a substrate, a drain contact, a gate, a body, a source, and a layer of narrow band gap material. The substrate is of a first conductivity type with a low doping concentration. The substrate has a surface. The drain contact is of a second conductivity type with a high doping density. The drain contact is formed in the substrate adjacent the surface of the substrate. The gate is positioned on the surface of the substrate. The body is of the first conductivity type and is formed in the substrate adjacent the surface of the substrate. The source is of the second conductivity type with high doping concentration and is formed in the body adjacent a surface of the substrate. The gate is positioned in between the source and the drain contact. The layer of narrow band gap material is positioned on the surface of the substrate adjacent the body and at least a portion of the source to reduce parasitic bipolar transistor action. In addition, the layer of narrow band gap material has a narrower band gap than the band gap of the substrate.

BRIEF DESCRIPTION OF THE DRAWINGS

The present invention can be more easily understood and further advantages and uses thereof more readily apparent, when considered in view of the description of the preferred embodiments and the following figures in which:

FIGS. 2A through 2D illustrate, in a cross-sectional view, the sequential formation of a quasi-vertical NDMOS according to one embodiment of the present invention.

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention relate to integrated circuits having devices formed with reduced parasitic HFE. More specifically, the present invention teaches the reduction of the parasitic HFE in a MOS device by reducing the band gap of the semiconductor material in a substrate proximate a region in which a source is formed. In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms, such as "on", "side" (as in "sidewall"), "higher", "lower", "over," "top" and "under" are defined with respect to the conventional plane or working surface being on the top surface of the wafer or substrate, regardless of the orientation of the wafer or substrate.

Figure 1:
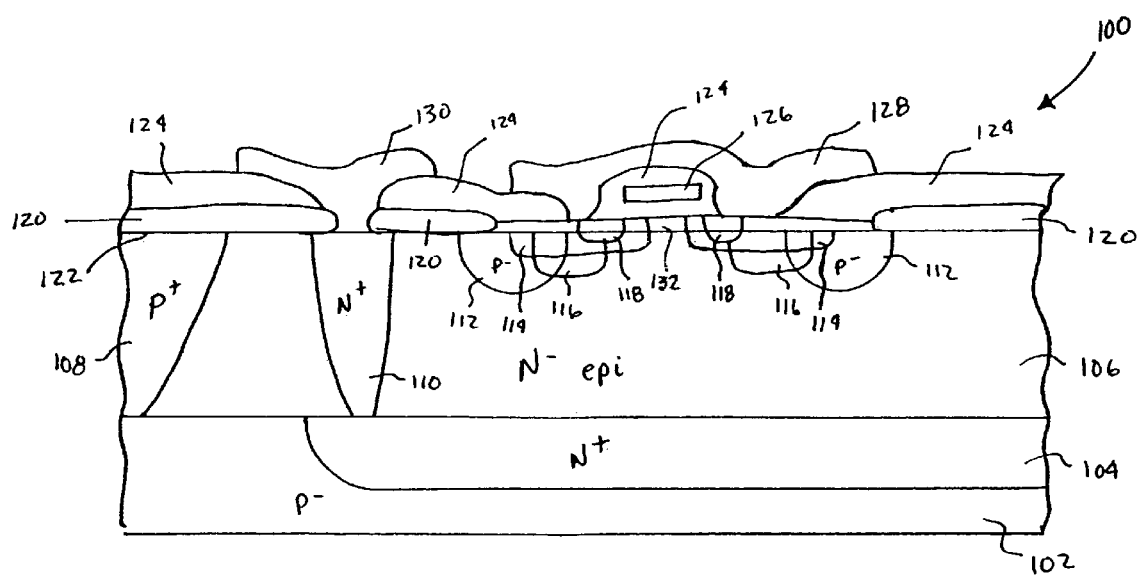
FIG. 1 is a cross-sectional view of a quasi-vertical NDMOS of one embodiment of the present invention.

A portion of a quasi-vertical NDMOS 100 in an integrated circuit of one embodiment of the present invention is illustrated in FIG. 1. As illustrated, the NDMOS 100 is made in a P− substrate 102. The NDMOS 100 has a N+ buried layer 104, a N− epi layer 106 (drain region 106), a P+ isolation region 108 and a N+ sinker diffusion region 110. The N+ sinker diffusion region 110 couples the N+ buried layer 104 with the working surface 122 (surface 122) of the substrate 102. The NDMOS 100 also has P− regions 112. Each of the P− regions 112 is diffused in a closed pattern so as to terminate an edge of an associated P body 114. The P body 114 may be referred to as a body region 114 or a perimeter body region 114. Each P body 114 has an associated P+ body contact 116. Moreover, the NDMOS 100 has N+ sources 118. In addition, the NDMOS has a first dielectric layer 120 and a second dielectric layer 124 that surrounds a gate poly 126. In one embodiment, the first and second dielectric layers are made of a silicon oxide and are referred to as a first and second oxide layer 120 and 124 respectfully. The gate poly 126 is positioned in the second oxide layer 124 proximate the sources 118. As illustrated, the NDMOS 100 also has a source-body contact 128 and a sinker drain contact 130. In one embodiment, both the source-body contact 128 and the sinker drain contact 130 are made of a metal.

The NDMOS 100 of FIG. 1 also has a layer of narrow band gap material 132. The layer of narrow band gap material 132 has a narrower band gap than the semiconductor material (N− epi layer 106) in which the P body 114 is formed. The layer of narrow band gap material 132 is used to reduce the parasitic HFE. In particular, the narrow band gap material 132 suppresses carrier injection from the source 118 into the body 114 thus reducing the parasitic HFE. At least a portion of the source 118 is formed in the layer of the narrow band gap material 132. As illustrated in the embodiment of FIG. 1, the source 118 is formed deeper from the surface 122 of the substrate 102 than the layer of narrow band gap material 132. Making the layer of narrow band gap material 132 relatively thin (less deep than the source 118) may be desired because a thin layer of narrow band gap material 132 is less likely to cause quality loss due to lattice mismatch. In one embodiment, the layer of narrow band gap material 132 is made of a SiGe alloy.

One method of the formation of the NDMOS 100 of FIG. 1 is illustrated in FIGS. 2(A–D). Referring to FIG. 2A, the NDMOS 100 is built in a junction isolated island of an integrated circuit. The island consists of a N+ buried layer 104 formed in a P− substrate 102. The N− epi layer 106 is formed after the N+ buried layer 104. The N+ sinker region 110 (sinker 110) is formed to connect the N+ buried layer 106 to a surface 122 of the substrate 102. The P+ isolation region 108 is formed to isolate the NDMOS 100 from other devices of the integrated circuit. As illustrated, two P− regions 112 are formed adjacent the surface 122.

Referring to FIG. 2B, the first dielectric layer 120 is the formed on the surface 122 of the substrate 102. In one embodiment, the first dielectric layer 120 is a first field oxide layer 120 formed using conventional local oxidation of silicon (LOCOS) processing methods. Portions of the first dielectric layer 120 are then removed. The remaining portions of the first dielectric layer 120 are used to form a mask. The layer of narrow band gap material 132 is then formed on an exposed surface area 122 of the substrate 102 in between two portions of the dielectric layer 120. As stated above, in one embodiment, the narrow band gap material 132 is a SiGe layer. The SiGe layer can be formed by any known method such as by epitaxial growth or by Ge implant to convert a layer of Si to SiGe.

Referring to FIG. 2C, a gate dielectric 125 is formed over the narrow band gap material. In one embodiment, the gate dielectric 125 is made from silicon oxide and is referred to as the gate oxide 125. A layer of poly gate material is deposited on the gate oxide 125 and patterned to form the poly gate 126 (gate 126) that is positioned proximate a medial portion of the gate oxide 125. The P bodies 114 are then implanted using the gate 126 as part of an implant mask and diffused. Accordingly, each of the P bodies 114 are self aligned with the gate 126. That is, one edge of each P body 114 is defined by an associated edge of gate 126. In addition, P− regions 112 terminate the other edge of each P body 114 to increase the P body to a N− epi junction-planar junction breakdown closer to a plane junction limit. Accordingly, the gate 126 and a respective P− region 112 define the lateral length of each P body 114. The P− regions 112 can also be referred to as stop regions 112. Each of the N+ sources 118 are implanted also using the gate 126 as part of a mask and are then diffused. Accordingly, the N+ sources 118 are also self aligned with the gate 126. Each P+ body contact 116 is then implanted. Each P+ body contact 116 is used to reduce the resistance of an associated P body 114 under an associated N+ source 118 to improve dv/dt performance. The P+ body contacts are formed before or after its associated P body 114 is formed. In one embodiment (not shown), the P+ body contacts 116 are not used because the layer of narrow band gap material 132 reduces the parasitic HFE to a desired level without the need for the P+ body contacts.

Referring to FIG. 2D, the second dielectric layer 124 is deposited over the surface 122 of the substrate 102. Portions of the second dielectric layer 124 are then removed adjacent the N+ sinker region 110 (sinker 110) and adjacent the P body 114 and source 118 regions. A metal layer is the deposited over the surface 122 of the substrate 102. Portions of the metal layer are then removed to form, the source-body contact 128 and the sinker drain contact 130. The source-body contact 128 couples the P bodies 114 with the sources 118 and a third contact is made to the gate 126 in a third dimension (not shown in Figures).

Although, FIGS. 2(A–D) only shows one gate segment, it will be understood in the art, that a typical NDMOS would have many such segments between edges that define the device within the integrated circuit. In addition, it will be understood in the art that the gate pattern of the device could take any of known patterns such as parallel strips or hexagonal.

Figure 3A:
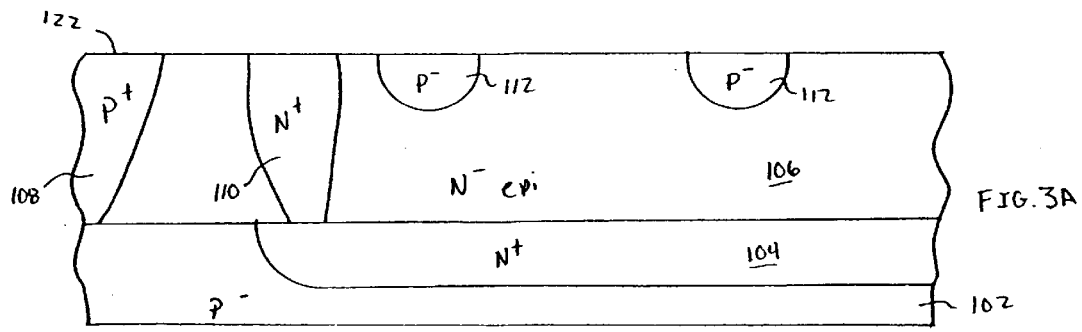
FIGS. 3A through 3D illustrate, in a cross-sectional view, the sequential formation of a quasi-vertical NDMOS according to one embodiment of the present invention.
Figure 3B:
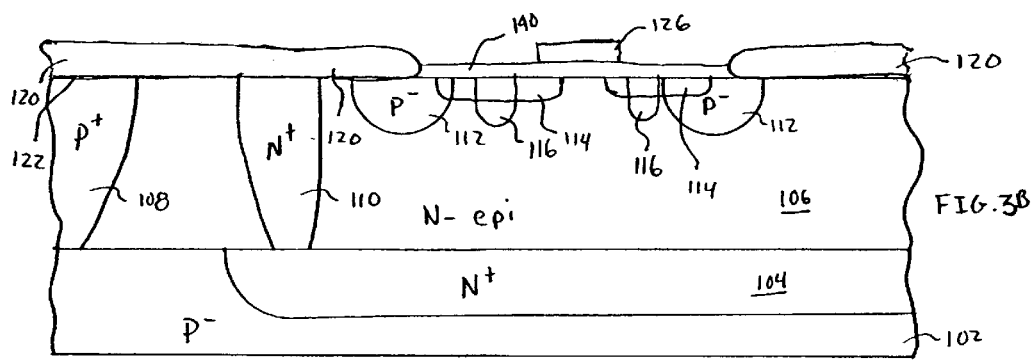
Figure 3C:
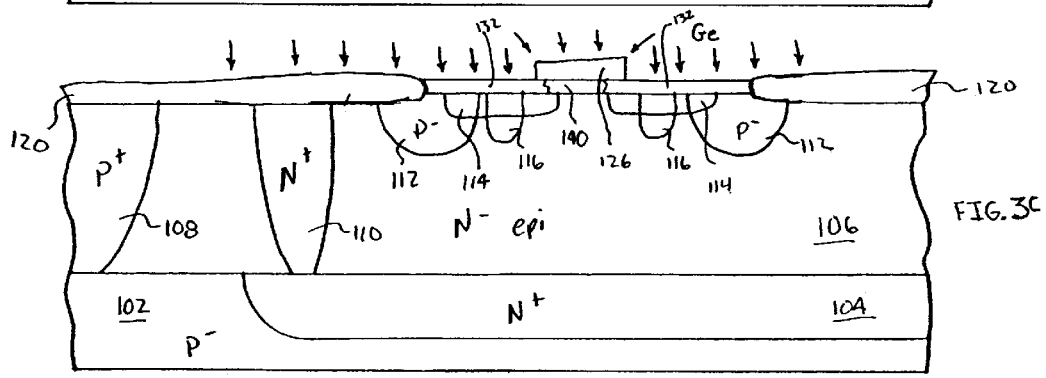

In another embodiment, the formation of the layer of narrow band gap material 132 of the NDMOS 100 is formed after the P body regions 114 are formed. In forming the NDMOS 100 in this manner, the layer of narrow band gap material 132 is not exposed to the diffusion of the P body regions 114. This reduces the chance of degrading the crystal quality of the narrow band gap material 132 due to thermal stress. As illustrated in FIG. 3A, the process sequence is the same as illustrated in FIG. 2A in forming the N+ buried layer 104, the N− epi layer 106, the N+ sinker 110, the P+ isolation region 108 and the P− regions 112. Thereafter, the first field oxide layer 120 is formed as illustrated in FIG. 3B. A portion of the first filed oxide layer 120 is then removed exposing a portion of the surface 122 of the substrate 102. A gate dielectric layer 140 (or as in one embodiment, a gate oxide 140) is formed over the exposed portion of the surface 122. A poly layer is then deposited on the gate oxide 140 and formed into the poly gate 126 or gate 126. The P bodies 114 are implanted using the gate 126 as a mask and diffused so that they are self-aligned with the gate 126. The P+ body contacts 116 may also be formed at this point.

After the P body regions 114 have been formed the layer of narrow band gap material 132 is formed by ion implant. As the result of this implant, the layer of narrow band gap material 132 is formed in a portion of an associated P body region 114 adjacent the surface 122 of the substrate 102. In one embodiment, Ge is used as the ion implant. Moreover, in one embodiment, the implant of the Ge ions is masked by the poly gate 126 and the first field oxide layer 120. In another embodiment, a photo resist mask is used to block the Ge implant from selected thin oxide regions of the integrated circuit. Moreover, in another embodiment, the mask used to form subsequent source regions (the source regions 118 of FIG. 3D), is used to form the narrow band gap material 132. This has the advantage of using an existing mask thereby reducing manufacturing costs.

In yet another embodiment, the implant is made using tilt angle implant technology to allow the Ge to extend under the gate 126 in the region where the N+ source will subsequently diffuse to insure the entire source region 118 is in the SiGe narrow band gap material 132. In still another embodiment, the narrow band material 132 is formed by selective epi growth. However, using a selective epi growth maybe less desired because it may be more difficult to encompass the entire N+ source region with the narrow band gap material 132 with the selective epi growth than it would be with the tilt angle implant method.

Figure 3D:
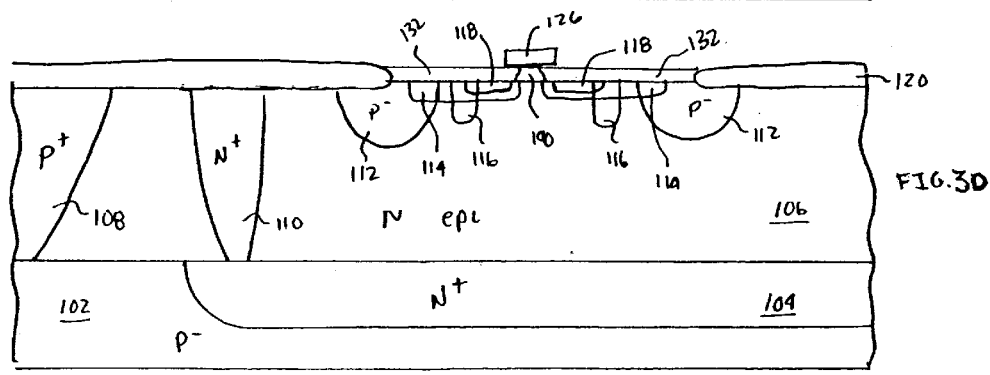

As illustrated in FIG. 3D, the source regions 118 are then formed by implant using the gate 126 as a partial mask so that the each source region 118 is self-aligned with the gate 126. The process is completed by the steps as illustrated in FIG. 3D to produce the NDMOS of FIG. 1.

Figure 4:
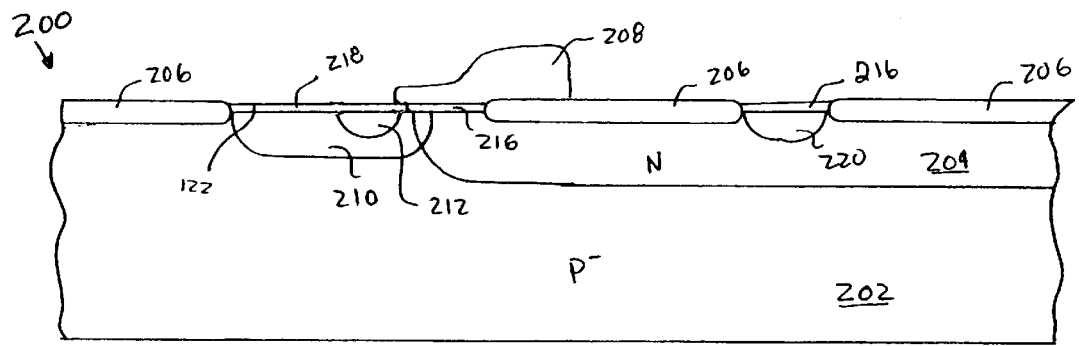
FIG. 4 is a cross-sectional view of a lateral NDMOS of one embodiment of the present invention.

The present invention can also be implemented on a lateral NDMOS of an integrated circuit. Referring to FIG. 4 an embodiment of a lateral NDMOS 200 of the present invention is shown. The lateral NDMOS 200 is built in a P– substrate 202. As illustrated the lateral NDMOS 200 includes a N drain extension 204, a first layer of dielectric 206, a gate dielectric 216, a P body region 210, a N+ source 212, a N+ drain contact 220 and a layer of narrow band gap material 218 proximate the source 212. In one embodiment, the first layer of dielectric 206 is a first layer of oxide 206 and the gate dielectric is a gate oxide 216. The substrate 202 of the lateral NDMOS 200 is at ground voltage. As illustrated in FIG. 4, the source 212 extends deeper from a surface 122 of the substrate 202 than the layer of narrow band gap material 218. Moreover, the source 212 is also at ground (in low side type circuit applications). The drain supports positive voltage which reverse biases the drain body junction. Thus, the lateral NDMOS 200 is self isolated allowing N well complementary metal-oxide semiconductor (CMOS) devices to be built in the same substrate 202 of the integrated circuit.

Figure 5A:
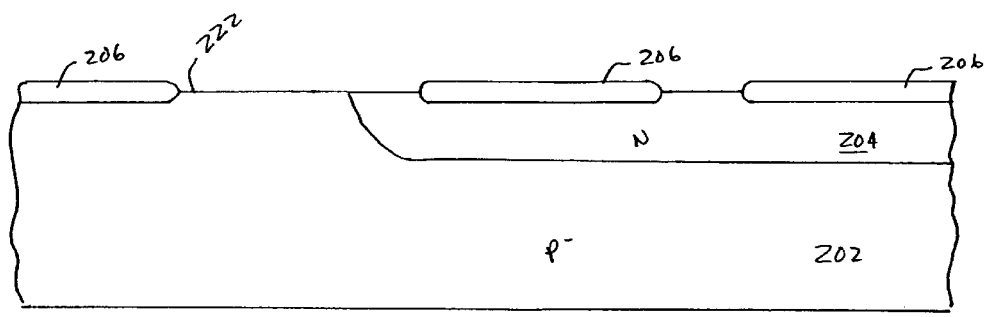
FIGS. 5A through 5C illustrate, in a cross-sectional view, the sequential formation of one embodiment of the lateral NDMOS of the present invention.

The lateral NDMOS 200 of FIG. 4 is formed by first forming the N drain extension 204 in the P– substrate 202. In one embodiment, the drain extension 204 extends generally from gate 208 to drain contact 220. Referring to FIG. 5A, the N drain extension 204 is formed by ion implant dopant deposition and diffusion to a final depth. The first layer of oxide 206 is formed on a surface 222 of the substrate 202 by LOCOS. Regions where LOCOS oxide is not grown provide access to the subsequent source 212 and drain contact 220 to be formed.

Figure 5B:
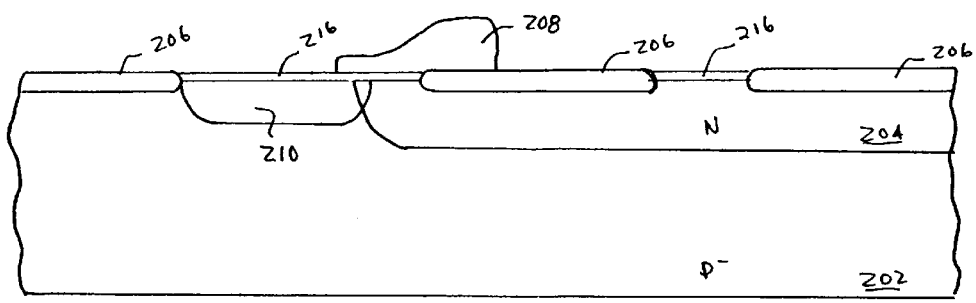
Figure 5C:
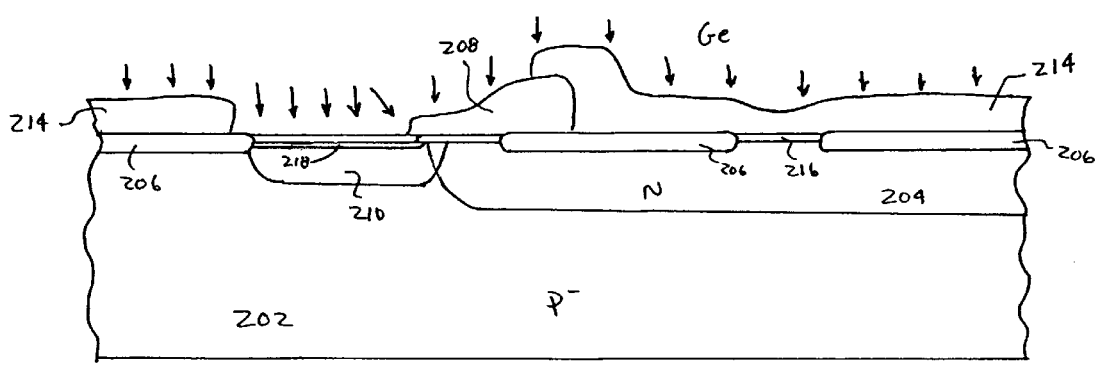

Referring to FIG. 5B, a layer of gate oxide 216 is then grown 216. The layer of gate oxide 216 covers the exposed surface 222 of the substrate 202. A poly layer is then deposited and patterned to form gate 208 (DMOS gate 208). The P body 210 is then formed using the gate 208 as a portion of a mask. Thus, the P body 210 (perimeter body region 210) is self-aligned with the gate 208. Referring to FIG. 5C, one embodiment of how the narrow band gap material 218 is then formed is illustrated. In this embodiment, a Ge tilt angle implant is used to extend the narrow band gap material 218 under an edge of the gate 208. In another embodiment, a standard implant is used (not shown). A photo resist layer 214 is used to cover those areas not needing the implant of the narrow band gap material 218. Once the narrow band gap material 218 has been formed, the source 212 and drain contact 220 are formed. The source 212 is self-aligned to the gate 208. The source 212 and drain contact 220 are illustrated in FIG. 4. In addition, in one embodiment, a source mask used to form the source 212 is also used in the Ge implant as a mask to form the narrow band gap material 218 thereby reducing the masking steps. Although, FIG. 5C illustrate forming the layer of narrow band gap material 218 after the gate 208, the layer of narrow band gap material 218 could be formed earlier in the process. For example, in one embodiment, a layer of narrow band gap material 218 is formed by either implant or selective epi before the gate 208 is deposited.

Figure 6:
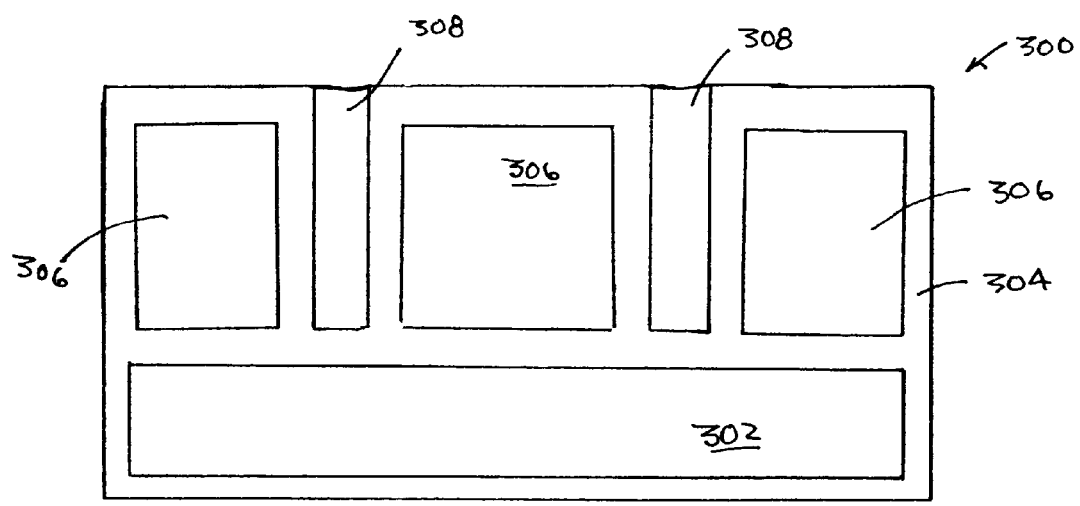
FIG. 6 is a cross-sectional view illustrating of an isolated island in integrated circuit of one embodiment of the present invention.

As stated above, the above-described devices having the narrow band gap material associated with a source to reduce the HFE of the devices are described as being formed in an integrated circuit. Typically, every device in the integrated circuit must be isolated from every other device in the integrated circuit. An example of a method of isolating a lateral DMOS device is illustrated in FIG. 6. The isolation structure 300 is made up of isolated islands 306 on top of a handle wafer 302. The islands 306 and the handle wafer 302 are covered with a layer of isolation oxide 304. In addition, a poly silicon region 308 is positioned between each island 306.

Figure 7A:
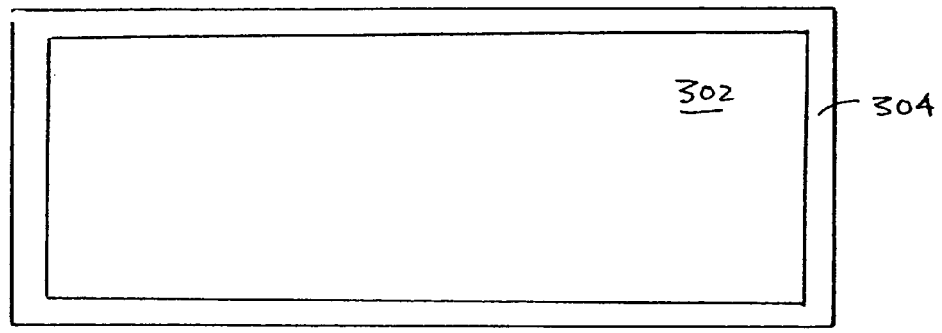
FIGS. 7A through 7C illustrate, in a cross-sectional view, the sequential formation of an isolated island of one embodiment of the present invention.
Figure 7B:
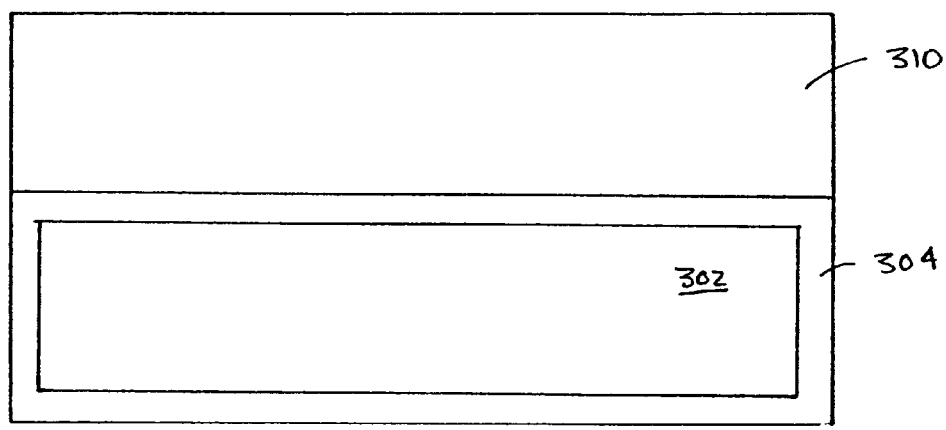
Figure 7C:
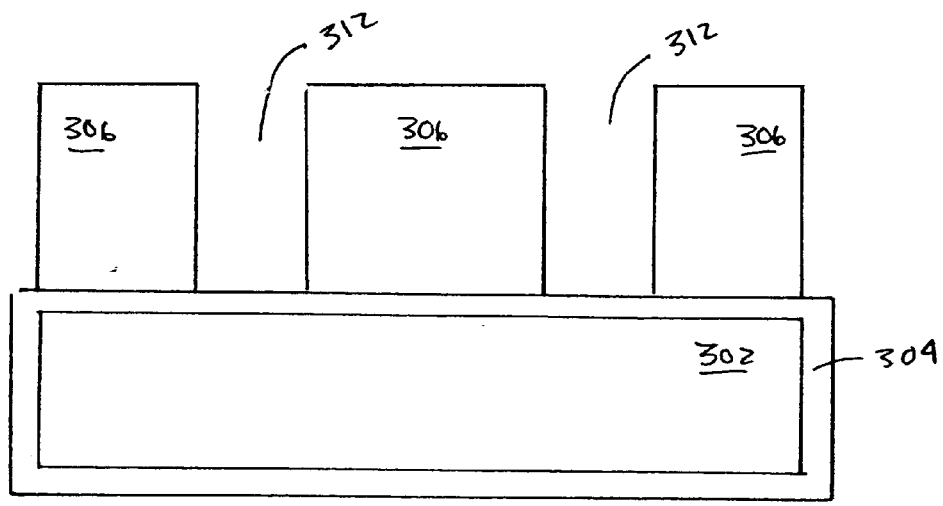

One method of forming the isolation structure 300 of FIG. 6 is illustrated in FIGS. 7(A–C). Referring to FIG. 7A, the handle wafer 302 is first oxidized to form the oxidation oxide layer 304 around the handle wafer 302. A device wafer 310 is placed in contact with the handle wafer 302 as illustrated in FIG. 7B. The device wafer 310 and the handle wafer 302 are then heated causing the device wafer 310 to be bonded to the handle wafer 302. The device wafer 310 is then thinned to obtain a desired thickness for the isolation structure 300. Referring to FIG. 7C, the device wafer 310 is then patterned and isolation trenches 312 are etched through it to the isolation oxide 304 on the handle wafer 302. A layer of isolation oxide 304 is then formed on the side walls of the trenches 312. The trenches 312 are then filled with the poly silicon 308 as illustrated in FIG. 6. The finished islands 306 are isolated on all sides by the oxide layer 304.

Figure 8:
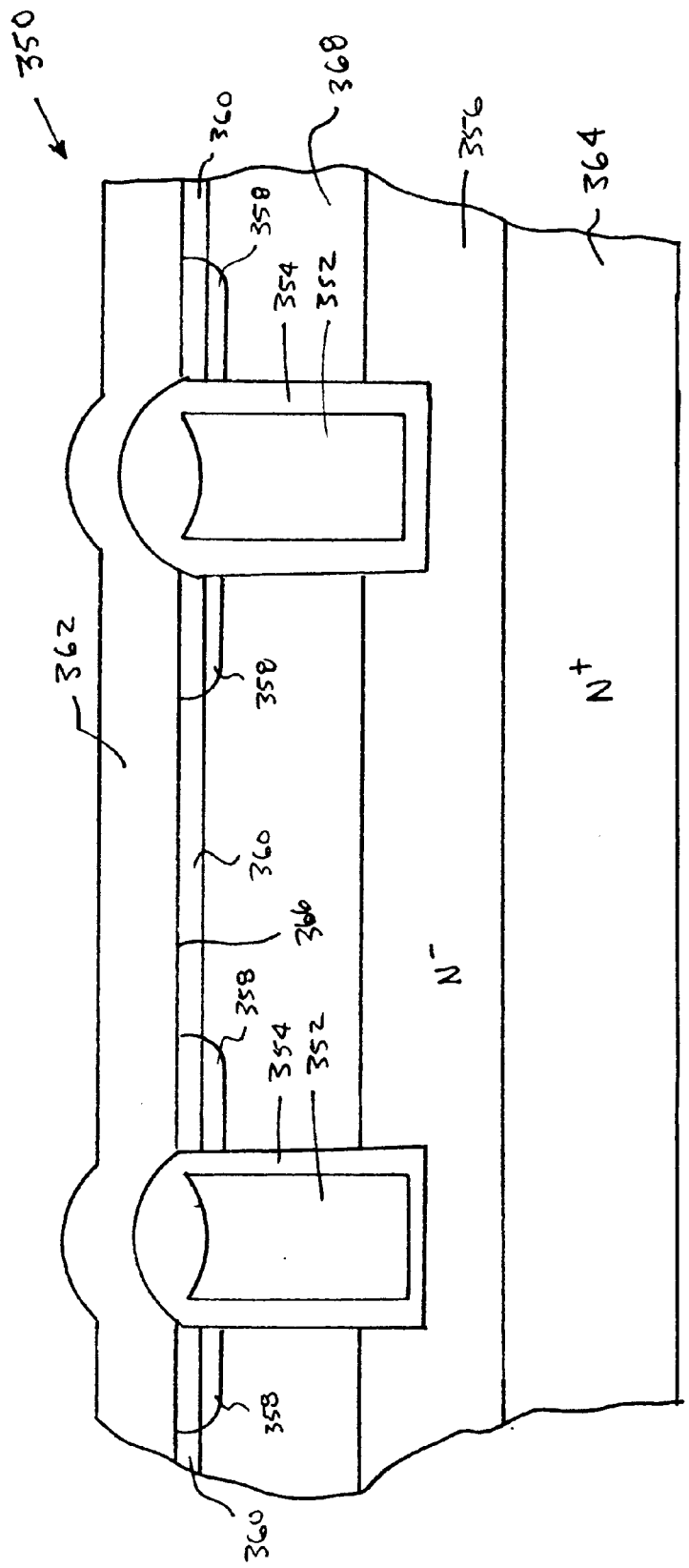
FIG. 8 is a cross sectional view of a trench gate NDMOS of one embodiment of the present invention.

Although, the present invention mainly applies to quasi-vertical and lateral devices having source regions, it may also apply to vertical devices. For example, referring to FIG. 8, a vertical trench gate NDMOS 350 of one embodiment of the present invention is illustrated. As illustrated, the trench gate NDMOS 350 has drain region 356 formed on a substrate 364. The substrate 364 of this embodiment is made of a N+ conductivity type. A P body region 368 is formed over the drain region 356. Gates 352 are formed through body 368 into drain 356. Gates 352 can be referred to as trench gates 352. Each gate 352 is isolated from body region 368 and drain region 356 by a layer of dielectric 354 (in this embodiment, a layer of oxide 354). N+ source regions 358 are formed in the P body region 368 approximate an associated gate 352 and adjacent a surface 366 of the substrate 364 as illustrated. A layer of narrow band gap material 360 is formed adjacent the surface 366 of the substrate 264. The layer of narrow band gap material 360 has a band gap that is narrower than the band gap of the material of the P body region 368. As illustrated, in this embodiment the source regions 358 and P body regions are formed deeper from the surface 366 of the substrate 364 than the layer of narrow band gap material 360. At least a portion of each source region 358 has to be formed in the layer of narrow band gap material 360. In addition, a source metal 362 is formed on the surface 366 of the substrate 362.

Figure 9A:
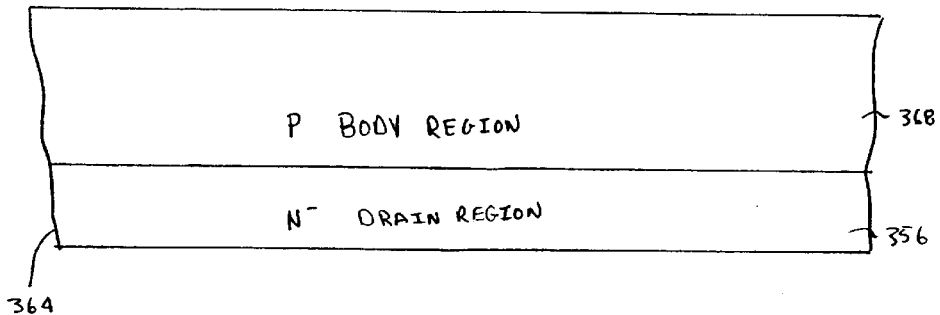
FIGS. 9A through 9C illustrate, in a cross-sectional view, the sequential formation of one embodiment of a trench gate NDMOS of the present invention.
Figure 9B:
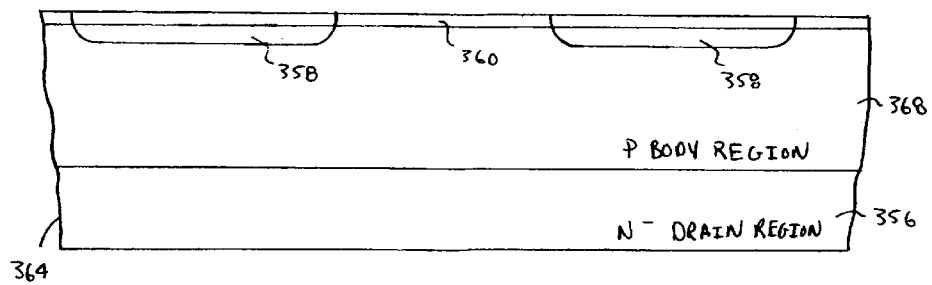
Figure 9C:
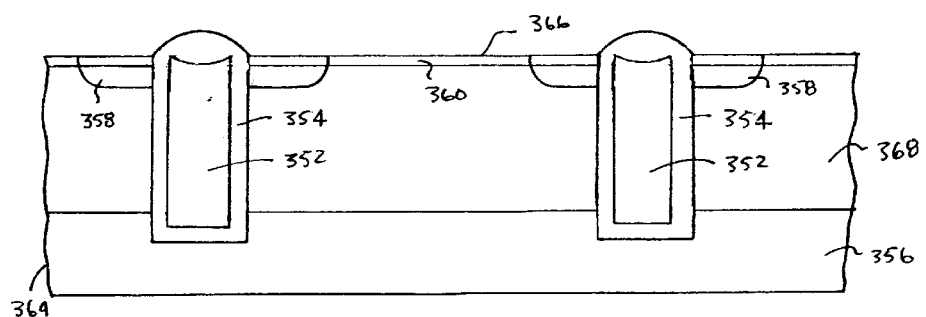

The formation of trench gate NDMOS 350 is illustrated in FIGS. 9(A–C). Referring to FIG. 9A, the N– drain region 356 is formed in the substrate 364. The P body region 368 is then formed in the surface of the N– drain region 356. The source regions 358 and the layer of narrow band gap material 360 are formed in the P body region 368, as illustrated in FIG. 9B. In one embodiment, the layer of the narrow band gap material 360 is formed before the source regions 358 are formed. The layer of narrow band gap material 360 can be formed by any known method such as epitaxial growth or implant. In one embodiment, the layer of narrow band gap material 360 comprises SiGe. Referring to FIG. 9C, the gates 352 are formed by etching trenches through the surface 366 of the substrate 364 at predetermined locations to the N– drain region 356. The gates 352 and their associated oxide layers 354 are formed in the trenches, as illustrated in FIG. 9C. In one embodiment, the oxide layers 354 are first deposited on the interior surfaces of the trenches and then the gates 352 are deposited. A layer of oxide 354 is then deposited on top of each gate 354 thereby insolating each gate 352 with the layer of oxide 354. The source metal 362 is deposited on the surface of the 366 of the substrate 364 to form the trench gate NDMOS of FIG. 8.

Figure 10:
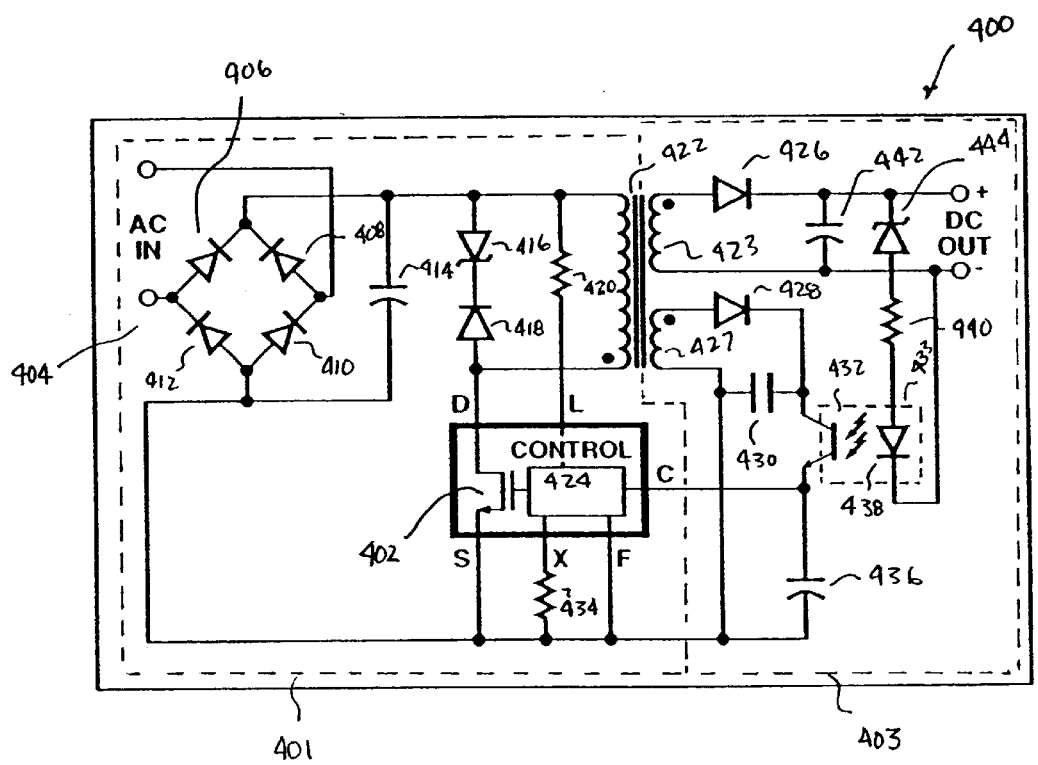
FIG. 10 is a schematic diagram of a switching power supply control circuit using a quasi-vertical NDMOS of one embodiment of the present invention.

An example of a quasi-vertical NDMOS transistor 402 of the present invention in an integrated circuit is illustrated in FIG. 10. FIG. 10, illustrates a switching power supply control integrated circuit (power circuit) 400. The use of the quasi-vertical NDMOS transistor 402 of the present invention provides robust power circuit 400. As illustrated, the power circuit 400 includes a diode bridge 406 that comprises diodes 406, 408, 410 and 412. The diode bridge 406 performs full bridge rectification of the input AC voltage. Transformer 422 provides galvanic isolation between input and output sections 401 and 403 (primary and secondary sides 401 and 403) of the circuit 400 as well as participating in the voltage conversion process. Energy is transferred from the primary side 401 to the secondary side 403 through the transformer 422. The transfer is accomplished by switching the NDMOS transistor 402 on and off with a duty cycle that is controlled to achieve the desired output voltage.

Input capacitor 414 of the primary side 410 stores the rectified input voltage from the bridge rectifier 406. Current is drawn from the input capacitor 414 through the primary side of the transformer 422 and the small resistance of NDMOS 402 when the NDMOS 402 is on. Moreover, current flows through forward biased diode 418 and reversed biased diode 416 (which is operating at breakdown) when the NDMOS is off until all energy stored in the inductance of the transformer 422 is discharged or the NDMOS 402 is turned on. The NDMOS 402 drain D is exposed to a voltage equal to the voltage on the input capacitor 414 plus the forward voltage drop of diode 418 and the break down voltage of reversed biased diode 416. Diode 416 serves to limit the fly back voltage induced by the inductor holding current constant when the NDMOS 402 turns off. Resistor 420 is coupled to bleed off current into an internal power supply that powers the control chip 424 from the voltage stored on the input capacitor 414. Resistor 434 sets an external current limit for the control chip 424.

Diode 426, capacitor 442, diode 444 and resistor 440 along with the upper secondary windings 423 of the transformer 422 provide the output of the circuit 400. In particular, current in the upper secondary windings 423 of the transformer 422 flows through diode 426 and charges output capacitor 442 to provide the output voltage. Diode 426 prevents the output capacitor 442 from discharging through the upper secondary windings 423 at times when the secondary voltage drops below the output voltage. The output voltage is set to the desired value by adjusting the on duty cycle of the NDMOS 402 (NDMOS switch 402). The output voltage is sensed and feed back to the controller to facilitate this process.

Light emitting diode 438 and photo transistor 432 form an opto isolator circuit 433. Current flows through light emitting diode 438 when the output voltage rises above the breakdown voltage of diode 444 plus the forward voltage of diode 438. The current is equal to the difference between the output voltage and the sum of the two diode (diode 444 and 438) voltages divided by resistor 440. The current is multiplied by the gain of the opto coupler 433 and delivered to capacitor 436. The input voltage is reflected into lower secondary windings 427 of the transformer 422 by the turn ratio. This provides collector current for the collector of the output opto coupler 433 and charges capacitor 430. The control circuit 424 senses the voltage on capacitor 436 and uses it as a feed back signal to adjust the duty of the NDMOS 402.

Figure 11:
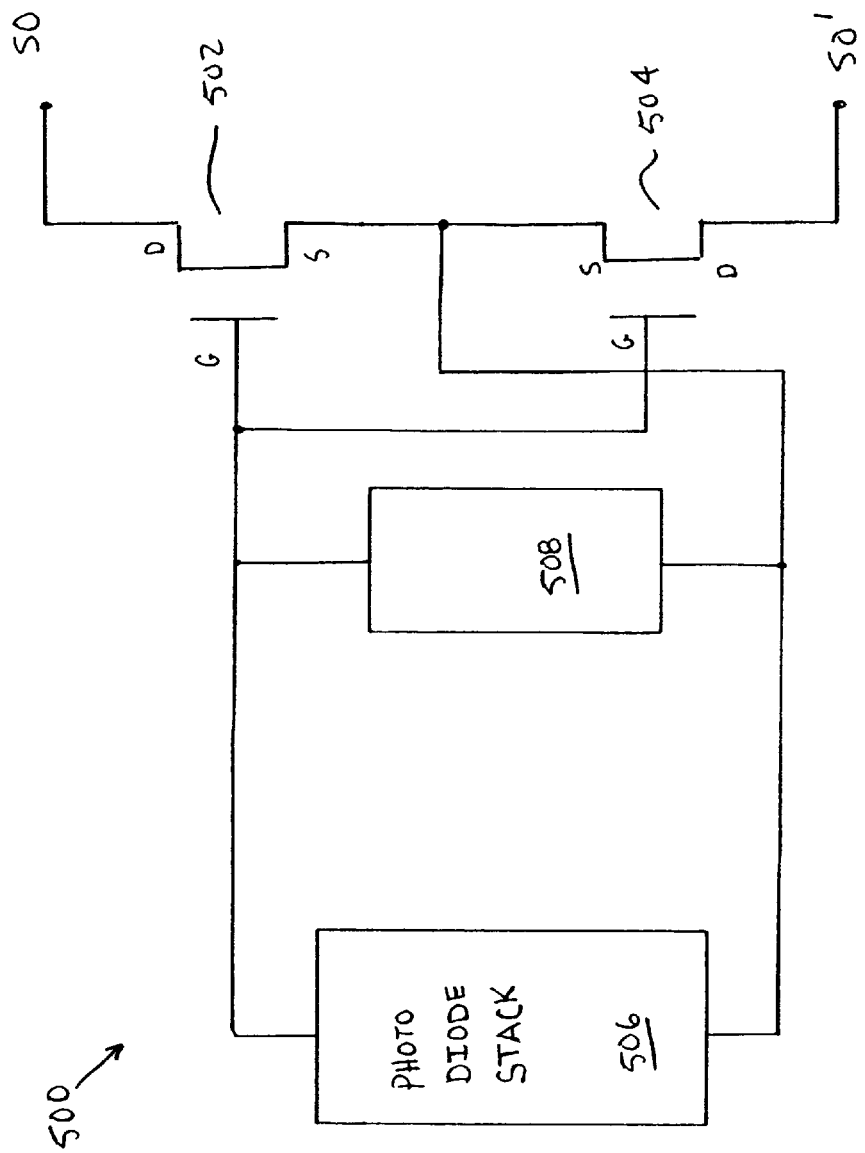
FIG. 11 is a schematic diagram of a solid state relay using a lateral NDMOS of one embodiment of the present invention.

An embodiment of a solid state relay circuit 500 using a pair of high voltage lateral NDMOS transistors 502 and 504 as described above, is illustrated in FIG. 11. As illustrated, the solid state relay circuit 500 includes a photo diode stack 506, a turn off and gate protection circuit 508 and two lateral NDMOS devices 502 and 504 in an integrated circuit. The photo diode stack 500 is used to drive voltage to the source S and gate G of each lateral NDMOS 502 and 504. Generally, the photo diode stack 500 is illuminated by a light emitting diode (not shown). The turn off and gate protection circuit 508 is coupled in parallel with the photo diode stack 506 to discharge any gate-source capacitance when the photo diode is not driving voltage to the source S and gate G of each lateral NDMOS 502 and 504. As illustrated, drain D of lateral NDMOS 502 is coupled to switch terminal S0. Moreover, drain D of NDMOS 504 is coupled to switch terminal S0'.

Photo diodes in the photo diode stack 506 have open circuit voltage and a short circuit current when illuminated. A set of N photo diodes are connected in series to form the photo diode stack 506. An open circuit voltage of the diode stack will be N times the open circuit voltage of a single photo diode. Moreover, the short circuit current of the photo diode stack 506 is equal to that of a single photo diode. Typically, an open circuit voltage of approximately 0.4V and a short circuit current of approximately 100 nA is produced by the solid state relay 500. A load comprising the gate capacitances of the two lateral NDMOS devices 502 and 504 is coupled to the photo diode stack 506 in the solid state relay 500. The gate capacitance is shunted by the turn off and gate protection circuitry 508 coupled in parallel with the photo diode stack 506. An equilibrium gate source voltage of the lateral NDMOS devices 502 and 504 in an off condition is 0V.

When the light emitting diode is turned on, illuminating the photo diode stack 506, the short circuit current of the photo diode stack 506 begins to charge the gate capacitance of lateral NDMOS devices 502 and 504. A gate-source voltage of each lateral NDMOS devices 502 and 504 rises as the respective gate capacitance charges until reaching the stack open circuit voltage. The number of photo diodes in the photo diode stack 506 is chosen such that its open circuit voltage is larger that the threshold voltages of the lateral NDMOS devices 502 and 504. Consequently, the lateral NDMOS devices 502 and 504 turn on when the stack is illuminated thereby presenting the ON resistance of the lateral NDMOS devices 502 and 504 in series with the switch terminals S0 and S0'.

Lateral NDMOS device 502 and 504 are coupled in series to form a switch to block relatively large voltages, of both polarities, across the switch terminals S0 and S0' when the switch is off. This exploits the fact that the lateral NDMOS devices 502 and 504 each have asymmetric breakdown with the drain to source breakdown being relatively large while the source to drain breakdown is relatively small (often as small as a diode forward voltage). By having the lateral NDMOS devices 502 and 504 coupled in series, the drains D of the devices 502 and 504 are coupled to their associated switch terminals S0 and S0'. When switch terminal S0 has a positive voltage that is more positive than the voltage on switch terminal S0', the drain junction of the lateral NDMOS device 502 blocks the applied voltage. Moreover, when switch terminal S0' has a positive voltage that is more positive that the voltage on switch terminal S0, the drain junction of lateral NDMOS device 504 blocks the applied voltage.

Turn off of the solid state relay 500 is initialized when the LED is turned off. An output current of the photo diode stack 506 then goes to 0V. The turn off and gate protection circuit 508, which in its simplest form may comprise a relatively large resistor, discharges the gate capacitance of gate G of the lateral NDMOS devices 502 and 504 thereby taking the gate source voltage back to 0V on both lateral NDMOS devices 502 and 504.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A metal oxide semiconductor (MOS) integrated circuit device comprising:

a substrate having a working surface;

at least one body region of a first conductivity type formed in the substrate proximate the working surface of the substrate;

a layer of narrow band gap material for each body region, each layer of narrow band gap material is positioned in a portion of an associated body region and proximate the working surface of the substrate, each layer of narrow band gap material has a band gap that is narrower than the band gap of the substrate in which each of the body regions are formed; and a source region of a second conductivity type formed in each of the body regions, wherein at least a portion of each source region is also formed in an associated layer of narrow band gap material.

2. The metal oxide semiconductor (MOS) integrated circuit device of claim 1, wherein each layer of narrow band gap material suppresses carrier injections from each of the source regions into associated body regions thereby reducing parasitic HFE.

3. The MOS integrated circuit device of claim 1, wherein each layer of narrow band gap material is formed in an associated body region adjacent the working surface of the substrate.

4. The MOS integrated circuit device of claim 1, wherein each layer of narrow band gap material comprises SiGe.

5. The MOS integrated circuit device of claim 1, wherein the source region is formed deeper from the working surface of the substrate than the layer of narrow band gap material.

6. The MOS integrated circuit device of claim 1, further comprising:

a gate; and a drain region formed in the substrate.

7. The MOS integrated circuit device of claim 6, wherein the drain further comprises a drain contact, the drain contact being coupled to the surface of the substrate.

8. The MOS integrated circuit device of claim 6, wherein the gate is deposited proximate the working surface of the substrate.

9. The MOS integrated circuit of claim 6, wherein the gate is a trench gate formed in the substrate.

10. A quasi-vertical double diffused metal oxide semiconductor (DMOS) transistor for an integrated circuit comprising:

a substrate having a surface;

one or more perimeter body regions formed in the substrate proximate the surface of the substrate, each of the perimeter body regions is of the first conductivity type;

a source of a second conductivity type with a high doping density formed in atl least one body region; and a layer of narrow band gap material positioned adjacent the surface of the substrate and the body regions, the narrow band gap material having a band gap narrower than a maximum band gap of the body regions, wherein at least a portion of each source is formed in the layer of narrow band gap material.

11. The quasi-vertical DMOS transistor for an integrated circuit of claim 10, wherein the narrow band gap material is used to reduce parasitic bipolar transistor action.

12. The quasi-vertical DMOS transistor for an integrated circuit of claim 10, wherein the layer of narrow band gap material is made of a SiGe alloy.

13. The quasi-vertical DMOS transistor for an integrated circuit of claim 10, further comprising:

a gate deposited over a surface of the substrate.

14. The quasi-vertical DMOS transistor for an integrated circuit of claim 10, further comprising:

a buried layer of the second conductivity type with a high doping density formed in the substrate;

an epi layer of the second conductivity type with a low doping density formed in substrate, wherein the buried layer is positioned between the epi layer and area of the substrate of the first conductivity type with the low doping density;

a sinker diffusion region of the second conductivity type with a high doping concentration formed through the epi layer to the buried layer to connect the buried layer to the surface of the substrate; and an isolation region of the first conductivity type with a high doping concentration extending from the surface of the substrate to the area of the substrate of the first conductivity with the low doping density, wherein the isolation region isolates the quasi-vertical DMOS transistor from other devices in the integrated circuit.

15. The quasi-vertical DMOS transistor for an integrated circuit of claim 10 further comprising:

a body contact of the first conductivity type with a high doping concentration associated with each body region to reduce the resistance of each body region.

16. The quasi-vertical DMOS transistor in an integrated circuit of claim 10, further comprising:

one or more stop regions of the first conductivity type with low doping density formed in the substrate adjacent the surface of the substrate for each perimeter body region, wherein an edge of each perimeter body region terminates in an associated stop region.

17. The quasi-vertical DMOS transistor for an integrated circuit of claim 10, further comprising:

a first dielectric layer positioned on the surface of the substrate, the first dielectric layer having apertures adjacent each source and a sinker diffusion region;

a second dielectric layer surrounding one or more gates, the gates are positioned on the surface of the substrate adjacent an associated source;

a sinker drain contact coupled to the sinker diffusion region; and a source-body contact coupled to each source and body.

18. The quasi-vertical DMOS transistor for an integrated circuit of claim 10, wherein the sinker drain contact and the source body contact are made of metal.

19. The quasi-vertical DMOS transistor for an integrated circuit of claim 10, wherein the source is formed deeper from the surface of the substrate than the layer of narrow band gap material.

20. A lateral DMOS transistor for an integrated circuit comprising:
- a substrate of a first conductivity type with a low doping concentration having a surface;
- a drain contact of a second conductivity type with a high doping concentration formed in the substrate adjacent the surface of the substrate;
- a gate positioned on the surface of the substrate;
- a body of the first conductivity type formed in the substrate adjacent the surface of the substrate;
- a source of the second conductivity type with high doping density formed in the body, wherein the gate is positioned in between the source and the drain contact; and
- a layer of narrow band gap material positioned in a surface portion of the body and at least a portion of the source, the layer of narrow band gap material having a narrower band gap than the band gap of the substrate.

21. The lateral DMOS transistor for an integrated circuit of claim 20, wherein the layer of narrow band gap material is used to reduce parasitic transistor action.

22. The lateral DMOS transistor for an integrated circuit of claim 20, further comprising:
- a drain extension of the second conductivity type formed in the substrate adjacent the surface of the substrate and extending from proximate the gate to the drain contact.

23. The lateral DMOS for an integrated circuit of claim 20, further comprising:
- a first dielectric layer positioned on the surface of the substrate, the first dielectric layer having apertures adjacent the source and the drain contact, wherein a portion of the first dielectric layer is positioned between a portion of the gate and the surface of the substrate.

24. The lateral DMOS for an integrated circuit of claim 20, wherein the layer of narrow band gap material is formed by selective epi.

25. The lateral DMOS for an integrated circuit of claim 20, wherein the layer of narrow band gap material is formed by implant.

26. The lateral DMOS for an integrated circuit of claim 20, further comprising:
- a first layer of gate dielectric formed over the surface of the substrate adjacent the source, wherein a portion of the gate dielectric is positioned between a portion of the gate; and
- a second layer of gate dielectric formed over the surface of the substrate adjacent the drain contact.

27. The lateral DMOS for an integrated circuit of claim 20, wherein the source is formed deeper from the surface of the substrate than the layer of narrow band gap material.

28. A vertical DMOS device comprising:
- a substrate;
- at least one gate;
- a dielectric layer insulating each gate from the substrate;
- a drain region formed in the substrate;
- at least one body region formed in the substrate adjacent the drain region and proximate a working surface of the substrate;
- a layer of narrow band gap material formed in each body region adjacent the surface of the substrate, wherein the layer of narrow band gap material has a narrower band gap than the band gap of the remaining portions of the body region; and
- a source formed in each body region, wherein at least a portion of each source is also formed in the layer of narrow band gap material.

29. The vertical DMOS device of claim 28, wherein the layer of narrow band gap material suppresses carrier injections from each of the source regions into associated body regions thereby reducing HFE.

30. The DMOS device of claim 28, wherein layer of narrow band gap material is positioned adjacent the working surface of the substrate.

31. The DMOS device of claim 28, wherein each gate is a trench gate formed in the substrate.

32. The DMOS of claim 28, further comprising:
- a layer of source metal deposited on the working surface of the substrate.

33. The DMOS device of claim 28, wherein the drain region is of a first conductivity type with a low dopant density, each body region is of a second conductivity type and each source region is of the first conductivity type with high dopant density.

34. The DMOS device of claim 28, wherein the layer of narrow band gap material is SiGe.

35. The DMOS device of claim 28, wherein the source region extends deeper form the working surface of the substrate than the layer of narrow band gap material.

36. The DMOS device of claim 28, wherein the body region is formed deeper from the working surface of the substrate than the layer of narrow band gap material.

37. A switching power supply control circuit comprising:
- a diode bridge to perform full rectification of the input AC voltage;
- a transformer coupled to the diode bridge to provide galvanic isolation and voltage conversion;
- a quasi-vertical DMOS transistor coupled to control the voltage through the transformer;
- control circuitry coupled to a gate of the quasi-vertical DMOS transistor to switch the DMOS transistor on and off, wherein the control circuitry controls a duty cycle of the DMOS transistor to achieve a desired output from the transformer; and
- wherein the quasi-vertical DMOS transistor comprises,
  - a substrate of a first conductivity type with a low doping density having a surface, wherein the gate is formed overlaying the surface of the substrate,
  - one or more body regions formed in the substrate proximate the surface of the substrate, each of the body regions is of the first conductivity type,
  - a source of a second conductivity type with a high doping density formed in each body region, wherein each source and each body are positioned proximate an associated edge of the gate, and
  - a layer of narrow band gap material positioned adjacent the surface of the substrate and the body regions, the narrow band gap material having a band gap narrower than the semiconductor material of the body.

38. The switching power supply control circuit of claim 37, wherein at least a portion of each source of the quasi-vertical DMOS transistor is formed in the layer of narrow band gap material to reduce parasitic bipolar transistor action.

39. The switching power supply control circuit of claim 37, wherein the layer of narrow band gap material is made of a SiGe alloy.

40. The switching power supply control integrated circuit of claim 37 wherein the sources are formed deeper from the surface of the substrate than the layer of narrow band gap material.

41. A solid state relay integrated circuit comprising:
- a photo diode stack to drive a voltage having a first output and a second output;
- a first high voltage lateral DMOS having a gate, source and drain, the gate of the first high voltage DMOS is coupled to the first output of the photo diode stack, the source of the first high voltage DMOS is coupled to the second output of the photo diode stack;

a second high voltage lateral DMOS having a gate, source and drain, the gate of the second high voltage lateral DMOS is coupled to the first output of the photo diode stack, the source of the second high voltage lateral DMOS is coupled to the second output of the photo diode stack; and wherein the first and second high voltage lateral DMOS comprise,
- a substrate of a first conductivity type with a low doping concentration having a surface,
- a drain contact of a second conductivity type with a high doping density formed in the substrate adjacent the surface of the substrate,
- a gate positioned on the surface of the substrate,
- a body of the first conductivity type formed in the substrate adjacent the surface of the substrate,
- a source of the second conductivity type with high doping concentration formed in the body adjacent a surface of the substrate, wherein the gate is positioned in between the source and the drain contact, and
- a layer of narrow band gap material positioned on the surface of the substrate adjacent the body and at least a portion of the source, the layer of narrow band gap material having a narrower band gap than the band gap of the substrate.

42. The solid state relay integrated circuit of claim 41, wherein the layer of narrow band gap material in the first and second high voltage lateral DMOS is used to reduce parasitic bipolar transistor action.

43. The solid state relay integrated circuit of claim 41, wherein each of the first and second high voltage lateral DMOS further comprising:
- a drain extension of the second conductivity type formed in the substrate adjacent the surface of the substrate and extending from proximate the gate to the drain contact.

44. The solid state relay circuit of claim 41, further comprising:
- a turn off and gate protection circuit coupled in parallel with photo diode stack to discharge any gate source capacitance when the photo diode stack is not driving voltage to the first and second high voltage lateral DMOS.

45. The solid state relay of claim 41, further comprising:
- a first switch terminal coupled to the drain of the first high voltage lateral DMOS; and
- a second switch terminal coupled to the drain of the second high voltage lateral DMOS.

* * * * *